US009139924B2

(12) United States Patent
Ansari et al.

(10) Patent No.: US 9,139,924 B2
(45) Date of Patent: Sep. 22, 2015

(54) SYSTEMS AND PROCESSES FOR FORMING MOLDS SUCH AS NICKEL MOLDS

(75) Inventors: Kambiz Ansari, Singapore (SG); Christina Yuan Ling Tan, Singapore (SG); Yee Chong Loke, Singapore (SG); Jarrett Dumond, Singapore (SG); Isabel Rodriguez, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 262 days.

(21) Appl. No.: 13/593,272

(22) Filed: Aug. 23, 2012

(65) Prior Publication Data

US 2013/0048502 A1 Feb. 28, 2013

Related U.S. Application Data

(60) Provisional application No. 61/526,476, filed on Aug. 23, 2011.

(51) Int. Cl.
| | |
|---|---|
| *C25D 1/10* | (2006.01) |
| *C25D 1/00* | (2006.01) |
| *C23C 14/04* | (2006.01) |
| *C23C 14/20* | (2006.01) |
| *C23C 14/58* | (2006.01) |

(52) U.S. Cl.
CPC ............ *C25D 1/10* (2013.01); *C23C 14/046* (2013.01); *C23C 14/205* (2013.01); *C23C 14/584* (2013.01); *C23C 14/5873* (2013.01); *C25D 1/006* (2013.01)

(58) Field of Classification Search
CPC .................................. C25D 1/10; C23C 14/34
USPC .................................................... 205/70, 118
See application file for complete search history.

(56) References Cited

U.S. PATENT DOCUMENTS

| | | | |
|---|---|---|---|
| 7,638,027 B2 | 12/2009 | Teshima et al. | |
| 2010/0072069 A1 | 3/2010 | Shimada et al. | |

OTHER PUBLICATIONS

Ansari et al., Nickel molds with 3 dimensional micro/nano features for biochips application. The 9th International Conference on Nanoimprint and Nanoprint. 2010;:192-193.
Written Opinion and Search Report dated Aug. 16, 2013 issued in corresponding SG Application No. 201206282-4.
Ansari et al., "Nickel molds with 3 dimensional micro/nano features for biochips application", In: the 9th International Conference on Nanoimprint and Nanoprint, 2010, pp. 192-193.

(Continued)

*Primary Examiner* — Keith Hendricks
*Assistant Examiner* — Stefanie S Wittenberg
(74) *Attorney, Agent, or Firm* — Wolf, Greenfield & Sacks, P.C.

(57) ABSTRACT

For forming a nickel mold, a metal and a corresponding etchant are selected such that the etchant selectively etches the metal over nickel. The metal is sputtered onto a surface of a template having nano-structures to form a sacrificial layer covering the nano-structures. Nickel is electroplated onto the sacrificial layer to form a nickel mold, but leaving a portion of the sacrificial layer exposed. The sacrificial layer is contacted with the etchant through the exposed portion of the sacrificial layer to etch away the sacrificial layer until the nickel mold is separated from the template. Subsequently, the nickel mold may be replicated or scaled-up to produce a replicate mold by electroplating, where the replicate mold has nano-structures that match the nano-structures on the template. The metal may be copper.

17 Claims, 7 Drawing Sheets

(56) References Cited

OTHER PUBLICATIONS

Maciossek et al., "Galvanoplating and sacrificial layers for surface micromachining", Microelectronic Engineering, 1995, pp. 503-508, vol. 27.

Loechel, B., "Thick-layer resists for surface micromachining", Journal of Micromechanics and Microengineering, 2000, pp. 108-115, vol. 10.

Ansari, K., "Proton beam writing applications in microfluidics and nanoimprint lithography", Ph. D. Thesis, National University of Singapore, 2010.

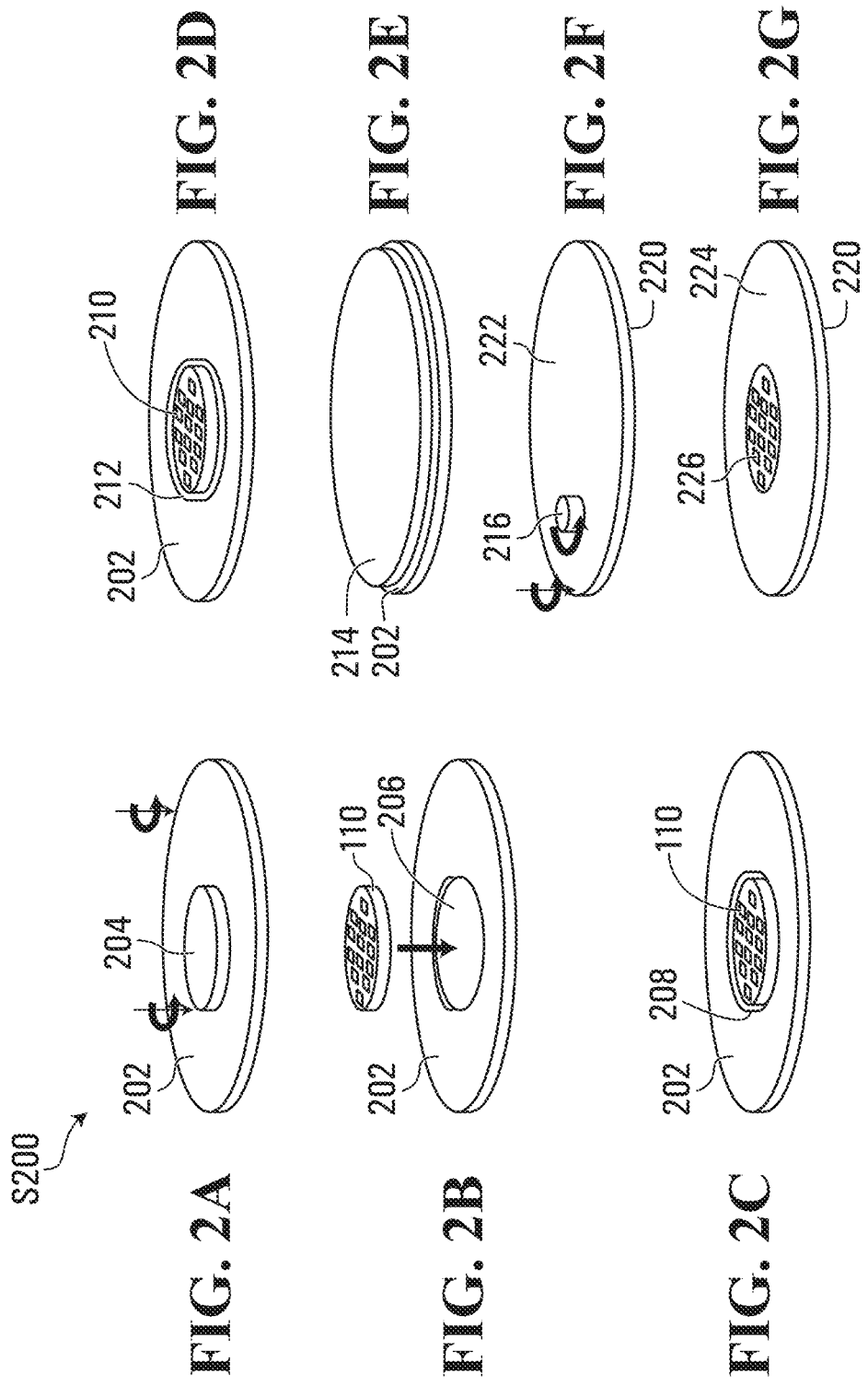

SYSTEMS AND PROCESSES FOR FORMING MOLDS SUCH AS NICKEL MOLDS

RELATED APPLICATION

This application claims the benefit of, and priority from, U.S. Patent Application Ser. No. 61/526,476, filed Aug. 23, 2011, and entitled "High resolution, High Aspect Ratio, Large Area Nickel Molds," the entire contents of which are incorporated herein by reference.

FIELD

Various aspects of the present invention generally relate to processes for forming nickel molds, particularly molds with surface nano-structures.

BACKGROUND OF THE INVENTION

In a known process for forming nickel (Ni) molds, a polymeric resist/resin is first spin-coated and patterned with the desired features on a substrate for forming the mold. Next, a metal film is deposited on the resist, which behaves as a conductive seed layer for further growth of a Ni layer onto the resist by electroplating. The plated Ni metal sheet is then separated from the resist, which forms the Ni mold. The surface of the Ni mold often contains polymeric residues, which are difficult to remove. Removal of such residues, such as by using a chemical solution that attacks the residues, may not remove the resist residues completely and can also reduce the surface quality of the mold as, for example, many removal agents also chemically attack Ni. It becomes more challenging to overcome these problems when epoxy-based resists such as SU-8 are used or when UV curable resins are used. In both cases, the resist or resin material adheres to the mold surface strongly, and when the mold has nano-scale features or patterns with high resolution, high density and high-aspect ratios, it may be difficult or impossible to remove it completely from the mold surface.

BRIEF SUMMARY OF THE INVENTION

In accordance with an aspect of the present invention, there is provided a method comprising selecting a metal and a corresponding etchant such that the etchant selectively etches the metal over nickel; sputtering the metal onto a surface of a template having nano-structures to form a sacrificial layer covering the nano-structures; electroplating nickel onto the sacrificial layer to form a nickel mold, leaving a portion of the sacrificial layer exposed; and contacting the sacrificial layer with the etchant through the exposed portion of the sacrificial layer to etch away the sacrificial layer until the nickel mold is separated from the template. Subsequently, the nickel mold may be replicated or scaled-up by electroplating to produce a replicate mold having nano-structures that match the nano-structures on the template.

The metal for the sacrificial layer may be copper. The etchant may be a mixture of water, ammonia and hydrogen peroxide. The sacrificial layer may have a thickness of about 10 nm to about 100 nm, such as about 50 nm. The nano-structures may have a feature size (e.g., an average feature size) or largest dimension from about 10 nm to about 100 nm. Exposure of the sacrificial layer to oxygen before etching the sacrificial layer may be limited to prevent oxidation of the metal in the sacrificial layer, such as by immersing the sacrificial layer in an inert gas or covering the sacrificial layer with a removable shield layer. The template may comprise a polymeric resist formed on a substrate. The Ni mold and the metal base may be integrated by electroplating. The method may further comprise passivating a surface of the Ni mold before the replicating. The nano-structures may have an overall area size or largest dimension of the area in which the nano-structures are located of about 5 cm to about 10 cm, and the replicated mold may have an overall size or largest dimension of about 20 cm to about 50 cm.

In another set of embodiments, the method includes the steps of forming a sacrificial layer onto a surface of a template having surface structures, said sacrificial layer comprising a metal; depositing nickel onto said sacrificial layer to form a mold, leaving a portion of said sacrificial layer exposed; and contacting said sacrificial layer with an etchant through said exposed portion of said sacrificial layer to etch at least a portion of said sacrificial layer to separate said mold from said template.

In yet another set of embodiments, the method includes the steps of forming a sacrificial layer comprising copper onto a surface of a template having surface structures; depositing nickel onto said sacrificial layer to form a mold, leaving a portion of said sacrificial layer exposed; and contacting said sacrificial layer with an etchant through said exposed portion of said sacrificial layer to etch away said sacrificial layer to separate said mold from said template.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures, which illustrate, by way of example only, embodiments of the present invention.

FIGS. 2A, 2B, 2C, 2D, 2E, 2F, and 2G are schematic diagrams for a process of scaling-up the mold of FIG. 1F, illustrating an embodiment of the present invention;

DETAILED DESCRIPTION OF INVENTION

In brief overview, it has been realized that nickel (Ni) molds with surface nano-structures can be conveniently formed with the use a sacrificial layer and an etchant that are of relatively high selectivity as against nickel, according to certain embodiments. In some embodiments, copper and a highly selective copper etchant can be used. Thus, for example, the highly selective etchant may be an etchant that selectively etches copper over nickel, e.g., the etchant etches copper preferentially relative to nickel. The etchant may not etch nickel, or may etch nickel but to a smaller degree than to copper. The Ni mold may be replicated by electroplating to produce a replicate mold having nano-structures that are negative copies of the nano-structures on the original Ni mold.

FIGS. 1A, 1B, 1C, 1D, 1E, and 1F illustrate a process for forming a nickel mold, exemplary of an embodiment of the present invention.

Figure 1A:
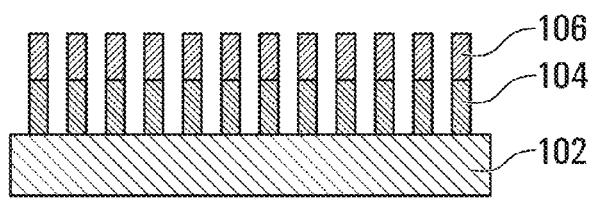
FIGS. 1A, 1B, 1C, 1D, 1E, and 1F are schematic diagrams for different stages in a process of forming a mold, illustrating an embodiment of the present invention.

In the exemplary process, a resist is formed on a substrate 102 to provide a template, as illustrated in FIG. 1A.

Substrate 102 may be formed from a Si wafer, such as those typically used in the semi-conductor industry.

As depicted, the resist may be provided with two layers of different materials, although more or fewer layers may also be used. The first layer 104 may be formed of, e.g., 2-(1-methoxy)propyl acetate, or propylene glycol monomethyl ether acetate (PGMEA). For example, PGMEA sold under the trade name TRANSPIN™, available from Molecular Imprints Inc., U.S., may be used to form layer 104. The second layer 106 may be formed of a prepolymeric mixture, e.g., containing about 30-50 wt % of acrylic ester, about 30-50 wt % of a silicone-containing acylate, about 10-20 wt % of a crosslinking agent, and about 1-5 wt % of a photoinitiator. For example, a product known as MONOMAT™, available from Molecular Imprints Inc., may be used to form layer 106. In a particular embodiment, layer 104 may have a thickness (or height) of about 60 nm, and layer 106 may have a thickness (or height) of about 40 nm. However, in other embodiments, other thicknesses (or heights) may also be used for each of these layers.

Layers 104 and 106 are patterned in this example to provide nano-structures on the top surface of the template for forming the desired mold. Nano-structures refer to surface structures, surface features, or surface patterns that have nano-scale characteristic sizes. For example, a characteristic or average size of a surface structure, such as a surface protrusion, may be its height, length, width, depth, and/or the distance between adjacent structures. A nano-scale size may be a size in the range of about 1 nm to about 100 nm or about 1000 nm. Common nano-scale sizes may be in the range of about 10 nm or 20 nm to about 100 nm. Surface nano-structures may have any shape. For instance, a nano-structure may have the general shape of a ridge, a bar, a disc, a cube, a cylinder, a needle, a wire, or the like. Surface structures on the template may have similar shapes or different shapes, and may be distributed regularly or irregularly depending on the particular application. For example, surface structures may form substantially parallel ridges, which may be linearly arranged or concentrically arranged. Nano-surface structures may also have different structural features on each individual structure.

The resist such as is depicted in layers 104 and 106 may be patterned in any suitable manner. For example, known techniques such as step-and-repeat lithography (SFIL) or roll-to-roll nanoimprint lithography (R2R) techniques may be adapted to form and pattern layers 104 and 106. The nano-scale features may have characteristic sizes in the range of about 10 to about 100 nm or about 1000 nm, such as about 20 to 100 nm. The patterned nano-scale features may have any desired shape and size depending on the particular application.

In different embodiments, a template with a different structure or made of different materials may be used.

Figure 1B:
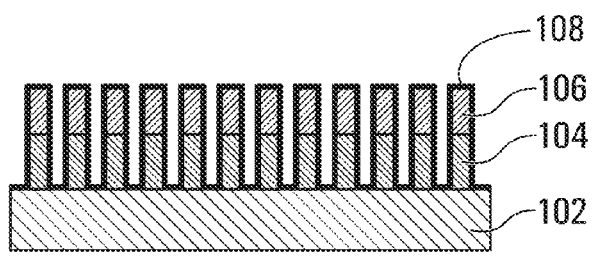

A metal layer 108 is formed on top of the patterned resist, or layer 106, as illustrated in FIG. 1B. Metal layer 108 may be formed of copper (Cu). In different embodiments, another metal such as Al, Cr, or Ti may be used. A suitable metal alloy, e.g., comprising one or more of these metals, may also be used. The metal may be selected such that a suitable etchant is available to selectively etch metal layer 108 over nickel (Ni), e.g., such that the etchant etches the metal layer preferentially over nickel. Thus, the etchant may not etch nickel, or may etch nickel but to a lesser degree or amount than the metal layer. In this regard, copper can be selectively etched over nickel, with relatively high selectivity, with an etchant formed of a mixture of water, ammonia and hydrogen peroxide. For example, Copper Etchant BTP, available from Transene Company, Inc. (USA), may be used. Other suitable etchants known to those skilled in the art with high selectivity between copper and nickel may also be used.

As compared to other metals mentioned above, for copper there are more selective etchants available against nickel, and copper may therefore be conveniently used. Copper is also relatively inexpensive, and can be etched at a relatively high etching rate. As will be appreciated, copper has relatively high electrical conductivity, which may be conveniently utilized in the present process. Conveniently, when copper and a suitable copper etchant with high selectivity against nickel are selected and used, the etching of copper can be performed with no or little damage to the nano-structures on the mold surface. However, as noted above, other metals may be used in other embodiments.

In comparison, if an etchant with insufficient selectivity against nickel is used, there is a risk that the surface nano-structure on the mold could be damaged or even destroyed during the etching of the sacrificial layer. While such risks are relatively low for forming molds with larger surface structures (e.g. micron-scale structures) or molds with small surface areas, the risks are increased for molds with large areas of nano-structures, such as when the nano-structures have high density and/or high aspect ratios.

Referring again to the example shown in FIG. 1, metal layer 108 may be formed on layer 106 by sputtering. Any suitable sputtering technique known to those skilled in the art may be adapted to form metal layer 108.

The thickness of metal layer 108 may vary depending on a number of factors including the sizes, resolution, and aspect ratio of the surface features on the template (resist), the density of surface patterns, or the like. In selected embodiments, the thickness of metal layer 108 may be from about 10 nm to about 100 nm. In some embodiments where the surface features on the resist are micron-sized, have an aspect ratio of more than 3, and/or a thickness of above 50 micrometers, the thickness of metal layer 108 may have any thickness up to about 50 nm. The aspect ratio may also be more than 5 or 10 in some embodiments.

Figure 1C:
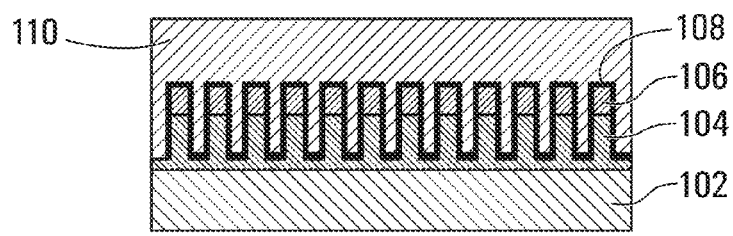

Next, a Ni mold 110 is formed on the template, or on top of metal layer 108, by electroplating nickel onto metal layer 108, as illustrated in the example of FIG. 1C. A portion of metal layer 108, usually on the sides as depicted, is still exposed, the reason for which will become apparent below. Ni mold 110 may have surface nano-structures that match the shapes and sizes of the surface pattern of the template. The thickness of Ni mold 110 may vary and may be selected depending on the particular applications in which it will be used. In selected embodiments, Ni mold 110 may have a thickness from about 40 to about 300 micrometers, such as from about 50 to about 300 micrometers.

Figure 1D:
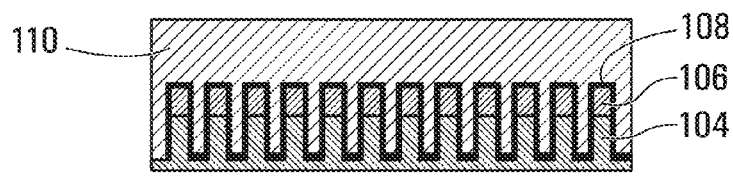

Optionally, substrate 102 may be removed from the resist, or layer 104, such as by etching, as illustrated in FIG. 1D.

Figure 1E:
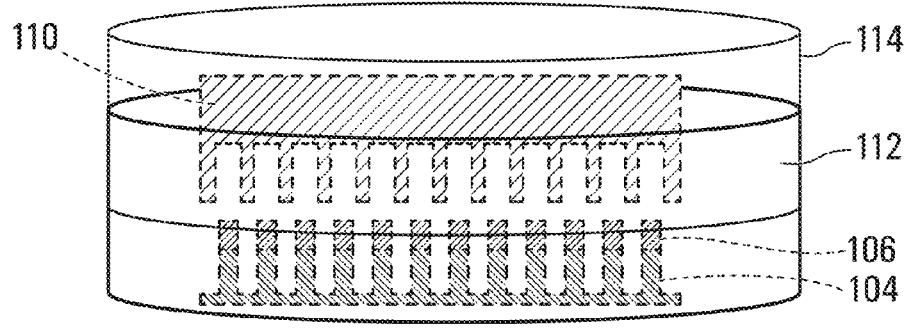

As illustrated in the example of FIG. 1E, an etchant may then be brought into contact with the exposed portion of metal layer 108, to selectively etch away metal layer 108. As metal layer 108 is removed, Ni mold 110 will become separated (self delaminated) from the template, which may include layers 104, 106, or both layers 104, 106 and substrate 102 depending on whether substrate 102 has been previously removed.

As depicted in FIG. 1E, contact between the etchant and metal layer 108 may be maintained by dipping the entire template into an etchant solution 112 in a container 114. However, in other embodiments, other methods may be used to expose metal layer 108 to the etchant. For example, the etchant may be sprayed or rubbed onto the metal layer.

As metal layer 108 is intended to be at least partially etched away, it is referred to as a sacrificial layer. It has been found that when the metal in metal layer 108, such as copper, is oxidized, it is relatively more difficult to remove the metal oxides by etching using a selected etchant that can selectively etch the selected metal such as copper. Thus, in some embodiments, depending on the selected metal and etchant, measures may be taken to prevent substantial oxidation of the metal. For example, to prevent oxidation of the metal in metal layer 108, exposure of metal layer 108 to oxygen such as air may be limited or prevented. This may be accomplished, for instance, by immersing the metal material in an inert gas (e.g., one that does not cause oxidation), such as $N_2$, during the relevant processing, such as during sputtering or electroplating. Covering materials may optionally be used for this purpose as well. For example, a protecting layer can be used to cover the metal surface after sputtering, and the protecting layer may be removed immediately before Ni electroplating. The protective layer could be formed of, e.g. a chromium layer, or a layer of resist material with a smooth surface. The wait time between different stages may also be shortened or limited to reduce oxidation of the metal layer 108 in some embodiments.

Figure 1F:
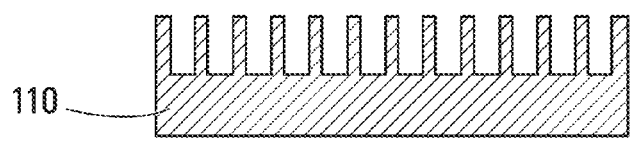

In the end, as shown in FIG. 1F, Ni mold 110 is separated, by self de-lamination, and its surface can be substantially free of residues of copper or any of the resist materials. The nano-structures on Ni mold 110 are negative copies of the nano-structures on the template in this example.

Ni mold 110 may also be copied, or replicated on, a base with a larger overall size, as illustrated in FIGS. 2A, 2B, 2C, 2D, 2E, 2F, and 2G.

As used herein, the terms "copy", "replicate", "replication", or "replicating" do not require the copied or replicated mold to be an exact copy of the original (master). Rather, the surface nano-structure on the replicate mold may be in some cases a negative copy of the nano-structure on the master mold, as illustrated below.

FIGS. 2A, 2B, 2C, 2D, 2E, 2F, and 2G illustrate a process for scaling-up and replicating mold 110 on a larger sized base.

As illustrated in FIG. 2A, a metal base plate 202 is provided for scaling-up and replicating a master mold, such as Ni mold 110.

In this example, base plate 202 may be formed initially by electroplating a dummy plate 204 on a Si substrate. Base plate 202 may have a disc shape as depicted in FIG. 2A, and may have a diameter of about, e.g., 8 inch (about 20.3 cm) and the dummy plate 204 may have a thickness of about 300 micrometers. However, other materials, shapes and dimensions for the base plate are also possible in other embodiments. Metal base plate 202 may be formed of alloyed base stainless steel, glass wafer, Si wafer, or other suitable materials. Dummy plate 204 may be formed of Ni or other suitable metals. Base plate 202 may have different shapes and sizes in different embodiments, but it is typically larger than the size of the master mold, and may have a size or diameter up to 20 inches (about 50 cm). To form base plate 202, the top surface of the substrate may be coated with a metal seed layer (not shown). The seed layer may be formed of any suitable metal, including the metals discussed above. Dummy plate 204 may then be formed on the substrate by electroplating or other suitable techniques. The edges on base plate 202 may be rounded in some embodiments, such as by laser cutting, to remove burrs on the edges, which may result due to higher electric fields at the edges that cause increased metal deposition.

As depicted in FIG. 2B, a central portion of base plate 202 is then removed to create an open area that matches the master mold to be replicated. The removed portion may be cut out using a laser or any other suitable technique. The cut-out portion may have a shape and depth that match the shape and size of the master mold in some embodiments.

The surface of base plate 202 may be covered with a protective sheet (not separately shown) during processing. For example, an adhesive tape such as NITTO™ tapes available from Nitto Denko Corporation, Japan, may be used as protective sheet. The protective sheet can be removed after the scale-up process is completed. The protective sheet may be used to keep the surface of base plate 202 defect-free and clean, so as to achieve a replicated mold with better quality.

A thin film 206 of magnetic foil of appropriate size to cover the opening on base plate 202 may be provided for magnetically clamping the master mold, mold 110 in this example. Film 206 is attached to the back (bottom) side of mold 110. Clamps (not shown) may be used to clamp mold 110 and base plate 202 to hold them in place. Film 206 can provide an electric contact to mold 110, and support mold 110 within the opening to keep mold 110 flat and stable. With film 206, when mold 110 and base plate 202 have the same thickness, they can be held together such that their top and bottom surfaces are flush with one another.

Before inserting mold 110 into the opening on base plate 202, mold 110 may optionally be subjected to surface treatment for various purposes. For example, the surface of mold 110 and base plate 202 may be subjected to passivation treatment, to reduce surface energy and/or prevent adhesion.

Passivation treatment may be carried out using any suitable formulation and technique. In some embodiments, one or more of the following chemicals may be used for this purpose: hydrogen peroxide ($H_2O_2$), potassium permanganate ($KMnO_2$), sodium perborate ($Na_2B_2O_3$), and sodium hypochlorite or sodium chlorate (I) (NaOCl). Other chemicals may be used as well. In a selected embodiment, for example, a solution containing about 10 wt % of $H_2O_2$ and de-ionized water may be used to passivate the mold surfaces before electroplating. The mold may be immersed in the passivation solution for about 5 min, and then dried with an inert gas such as $N_2$ and/or $CO_2$. As $H_2O_2$ may attack nano-structures on the mold surface, the passivation treatment time may be limited in some cases. In some embodiments, to reduce the treatment time, the passivation solution may be heated, e.g., to about 50° C.

The opening on base plate 202 may be sized in some embodiments such that its diameter is slightly larger than the diameter of mold 110, e.g., to facilitate insertion of mold 110 into the opening. As a result, a circular groove 208 may be formed between mold 110 and base plate 202, as illustrated in FIG. 2C, when mold 110 is clamped into place.

As illustrated in FIG. 2D, groove 208 is filled with a conductive epoxy 212, which may provide a flat and smooth top surface in the resulting mold. As the epoxy material is a soft fluid, its top surface may be horizontally level.

A conductive tape (not separately shown) may be used in some cases to provide electric contact between mold 110 and base plate 202.

The back side 222 of the resulting mold 220 may be polished or cleaned by and may have a smooth flat surface.

As illustrated in the example of FIG. 2E, a nickel layer 214 is formed by metal-on-metal plating against plate 202 and Ni mold 210, which then has surface structures that are negative copies of the nano-structures on Ni mold 110.

Nickel layer 214 may be separated (e.g., by delamination) from base plate 202 to provide a scaled-up and replicated mold 220, as shown in FIGS. 2F and 2G. Mold 220 may be shaped, for example, by laser cutting, and/or its back side 222 may be polished such as with a polishing device 216, as illustrated in FIG. 2F.

As illustrated in FIG. 2G, the front side 224 of mold 220 has nano-structures 226, which are negative copies of the nano-structures on mold 110 and match the nano-structures on the template shown in FIG. 1A. Replicate mold 220 is thus replicated from Ni mold 110 by electroplating in this example.

Figure 3:
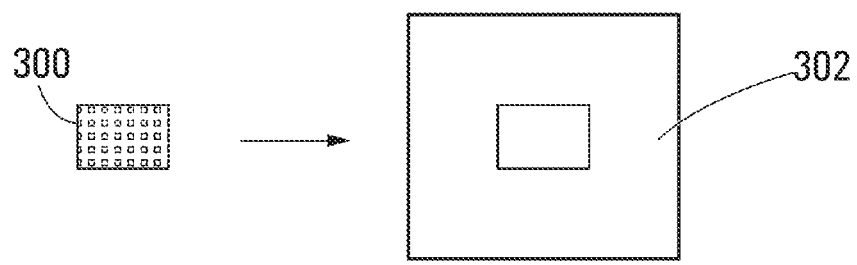
FIG. 3 is a schematic diagram of a rectangular mold and a scaled-up copy of the rectangular mold.

Of course, it can be appreciated that both the master mold, the base plate, and the replicated mold may have different shapes than those shown in the figures. For example, as illustrated in FIG. 3, a Ni mold 300 formed from an embodiment of the process illustrated in FIGS. 1A-1F may have a rectangular shape, which may be scaled-up on a rectangular base to form a scaled-up mold 302 using the process illustrated in FIGS. 2A-2G. Other shapes, regular or irregular, are also possible in other embodiments of the invention.

The Ni mold may be used in some embodiments in the production of CD, DVD discs or other similar products, and may be formed and further processed by adapting techniques commonly used in the CD and DVD industry. For example, the mold fabrication process may combine electroplating with high resolution lithographic techniques.

For example, in various embodiments, the fabrication process may include procedures to coat a conductive material onto a Si substrate, to spin coat a layer of resist on the conductive layer, to expose the resist using e.g. photolithography or electron/proton beam writing, to further treat or process the structures, to deposit a second metallization layer on the top surface, to electro-plate a material onto the structures and over-plate to form a base for a stamp, to delaminate the stamp from the substrate, and/or to cut, polish and clean the stamp. A selected combination of the above procedures may be utilized in a given embodiment.

The processes as illustrated in FIGS. 1A-1F and 2A-2G can provide, in some cases, a Ni mold or replicate with surface nano-structures that are substantially free from surface defects or residues due to delamination or separation of the mold from the original template, even when the nano-scale structures have relatively high aspect ratios (greater than 3, such as 5), and high resolutions (with nano-scale feature sizes as low as 15 nm).

In different embodiments, the resist on the substrate may be formed using different materials. For example, suitable materials or resins for forming resists may include SU-8 or other UV curable resist materials suitable for fabricating large area molds or high aspect ratio structures, including polymers that are difficult to remove from a Ni surface. Even with resists/resins that are highly crosslinked and are epoxy based, the resist can be conveniently separated from the Ni mold, e.g., by etching away the sacrificial layer as illustrated in FIGS. 1A-1F.

Even when the aspect ratio of the nano-features is high, the resist can be conveniently separated from the Ni mold in some cases, e.g., as illustrated in FIGS. 1A-1F, within a relatively short period of time and/or with a reduced risk of contamination or redeposition, as compared to for example separating a resist attached directly to a Ni mold by reactive-ion etching (RIE).

The processes described herein and illustrated in FIGS. 1A-1F may be relatively simple and easy to perform in certain embodiments, as compared to, e.g., laser removal techniques which can be complicated as many operation parameters will need to be optimized.

As the surface of the resulting Ni mold 110 may be substantially free of polymer or resin residues in some cases, it may not be necessary to clean or treat the mold surface with strong acid or other highly reactive cleaning solutions.

As a result, it is possible to achieve high yield or throughput in the production of Ni molds in various embodiments, e.g., as illustrated in FIGS. 1A-1F.

In a particular embodiment, the etchant solution may contain 30 wt % of a diluted Cu etchant, such as Copper Etchant BTP (Transene Company, Inc., USA). Other concentrations are also possible.

The example mold forming process described herein can be compatible with common fabrication processes in the semi-conductor industry. Due to its simplicity, it may also be implemented to provide a reliable and inexpensive process. The example process may also be adapted to be applied in a wide range of different applications, and can be used in a variety of different lithographic technique with the use of different types of resists, which may be UV curable or epoxy-based.

Ni molds with lager area bases may be conveniently formed as noted earlier. The area size may be as large as about 8 in (about 20.3 cm) or 12 in (about 30.5 cm) in some embodiments. Even larger sizes are possible in some cases. The surface features may have characteristic sizes as low as about 20 nm, or less in some cases. The surface quality of the Ni molds may be relatively high and may be relatively clean. In some embodiments, the resolution of the surface features on the Ni mold may be as low as about 15 nm or about 10 nm, or less in some cases.

The Ni mold may be replicated with high resolution and high quality, utilizing techniques such as surface passivation and metal-on-metal electroplating.

An embodiment of the Ni molds described herein may be used in nano-imprinting applications, or other applications. For instance, it may be used in injection molding for LEDS, solar cell concentrators, micro optical films, super lenses, optical security films, optical displays, and many other applications.

It should be understood that the specific embodiments described herein are for illustration purposes. Various modifications to these embodiments are possible and may be apparent to those skilled in the art.

Some embodiments of the invention are further illustrated with the following non-limiting examples.

EXAMPLES

Example I

In this example, a sample template with nanostructures on a substrate was formed by step and repeat lithography (SFIL). The substrate was made of a silicon (Si) wafer. A TRANSPIN™ layer of about 60 nm thickness was formed on the substrate, and a MONOMAT™ layer of about 40 nm thickness was formed on the TRANSPIN™ layer. The MONOMAT™ layer and the underlying portion of the TRANSPIN™ layer were patterned by an SFIL patterning technique to form surface nanostructures. The nanostructures had a depth of about 100 nm linear scale (L/S), and very high aspect ratio. Therefore, the entire Si substrate wafer was covered with TRANSPIN™ and the patterned area was formed of MONOMAT™ layer on top of TRANSPIN™ layer.

Figure 4:
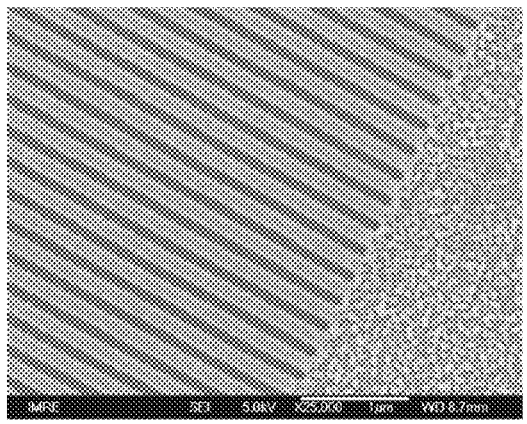
FIGS. 4, 5, 6, and 7 are scanning electron microscope (SEM) images of sample products formed from the processes of FIGS. 1 and 2.
Figure 5:
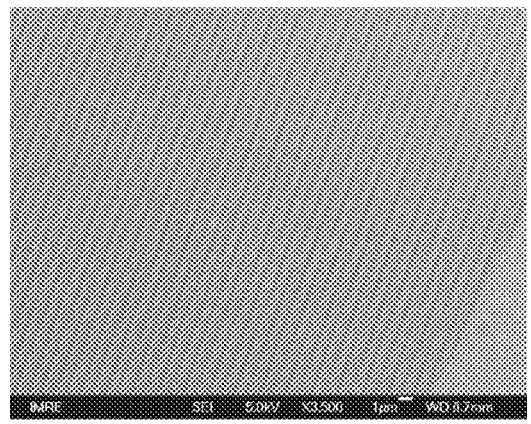

FIGS. 4 and 5 are SEM image of a portion of the SFIL nano-imprint formed on the sample Si wafer. As shown in FIG. 4, the surface structure had high resolution patterns of spaced 100 nm lines fabricated by a SFIL technique into the resin span on the Si wafer. As shown at low magnification in FIG. 5, these patterns had defect free, uniform straight lines and spacing with precise dimensions.

A thin Cu layer was sputtered on to the MONOMAT™ nanostructures. The Cu layer had a thickness of about 10 to about 50 nm. The thickness of the Cu layer was adjusted finely as the size of the structures limits the sputtering to a very thin layer of Cu on the surface to avoid losing the resolution of the nano-patterns. The thickness of the sputtered Cu layer was carefully controlled as its uniformity was found to have a significant impact on the result of the process.

Nickel was immediately electroplated on to the Cu layer after sputtering the Cu layer, to avoid oxidation of the sputtered Cu layer.

Figure 6:
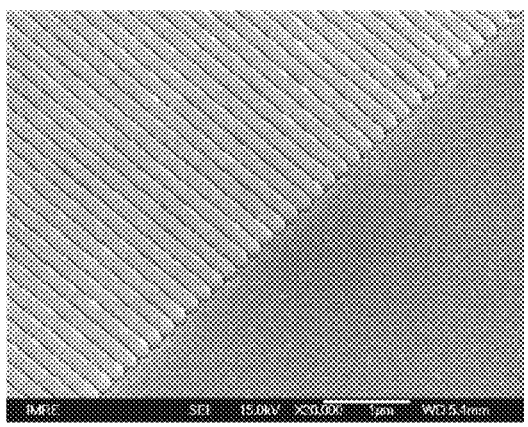
Figure 7:
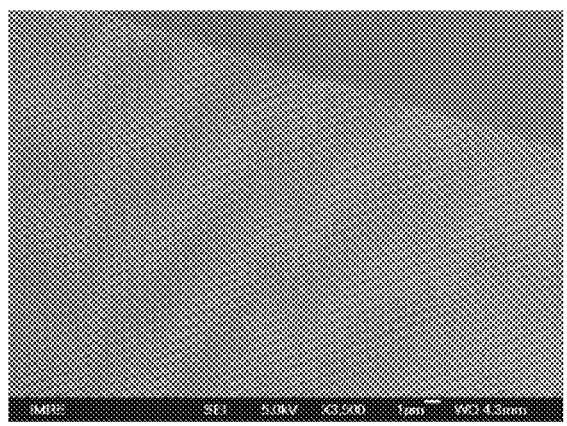

FIGS. 6 and 7 show SEM images of a portion of the sample after Ni plating, with Ni nano-features replicated from SFIL patterns. FIG. 6 shows the surface pattern of a replicate mold with exact negative features of the nano-features shown in FIGS. 4 and 5. FIG. 7 shows a low magnification SEM image of the same copied mold, showing large areas with similar negative features. Again, there were no observable defects in the straight lines and spaces, which also had precise dimensions as in the original structures.

Both during sputtering and electroplating, the sample was immersed in $N_2$ to prevent oxidation of Cu.

The Cu sacrificial layer was immediately etched by dipping the entire sample into the etchant solution. The etchant solution used was Copper Etchant BTP obtained from Transene Company, INC. MA (USA). It was found during testing that if the Cu sacrificial layer was allowed to stand for a day with exposure to air, oxidation of the Cu layer would make it more difficult to remove the Cu sacrificial layer by etching. The entire sample was immersed in the etchant solution for 3 min, and then flushed with de-ionized water.

After the Cu layer was etched away, the Ni mold was separated (delaminated) from the template (resist and substrate).

There was no residue of MONOMAT™ or TRANSPIN™ resin remaining in the nano-scale cavities on the Ni mold.

This process was repeated to form different sample Ni molds. Among the sample Ni molds formed, some molds had deep nanostructures formed by ultra-violet (UV) patterning with about 80 nm L/S feature size; some molds had about 110 nm L/S feature size and were subjected to anti-adhesion surface treatment for use as DVD Blu-ray Disc molds; and some molds had about 20 nm L/S feature size and were suitable as hard disk molds.

After etching removal of the sacrificial Cu layer, the Ni mold with surface nanostructures was easily removed and separated from the underlying template.

Figures 8, 9:
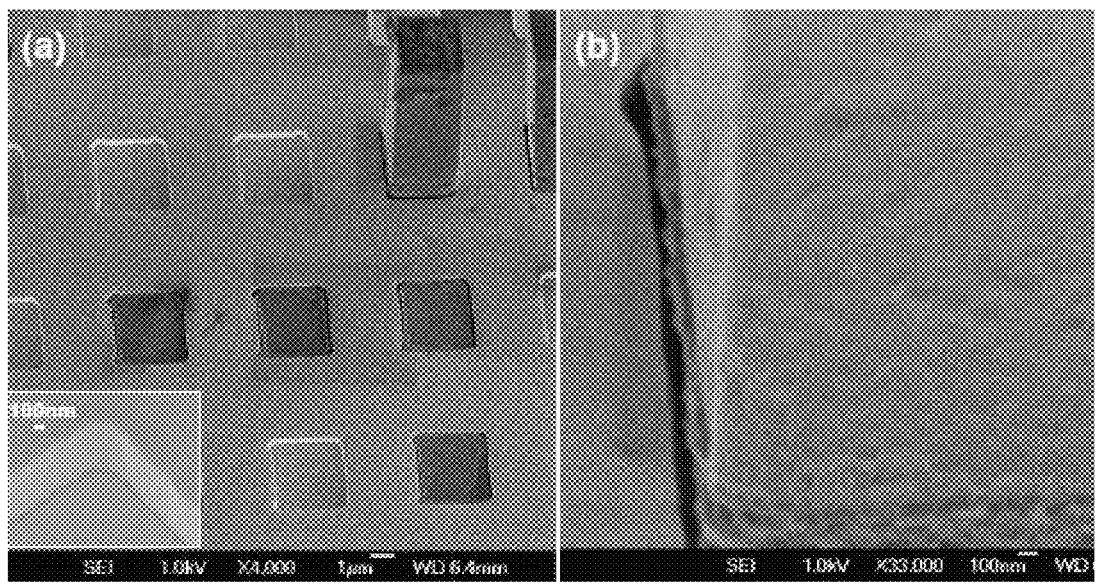
FIG. 8 is an SEM images of a sample template for use in the process of FIG. 1.
FIG. 9 is an SEM image of a cross-section of an interfacial region between the sample template of FIG. 8 and a Ni mold formed thereon after removal of the sacrificial layer in the process of FIG. 1.

In some samples, SU-8 was used to form high aspect ratio, high resolution features. A sample template formed using a SU-8 resist is shown in part in FIG. 8. As shown in FIG. 8, the template had a SU-8 pillar with a height of 10 micrometers, and the electroplated Ni structures had feature sizes of 2 micrometers. The SU-8 resist was spin coated on a Si wafer with 20 nm Cr plus 50 nm Au as seed layers for electroplating. After patterning a grid in SU-8 resist by UV lithography, the grid was electroplated using Ni electroplating process up to 2 micrometers. The inset in FIG. 8 is a close-up view of the plated grid.

A cross-sectional image of the interface region between the SU-8 resist and the Ni mold after removal of the sacrificial layer is shown in FIG. 9, from which it can be seen that the SU-8 resist was loosely attached to the Ni mold and could be easily separated from the Ni mold. However, removing of the SU-8 at the last step was challenging as shown.

Example II

Figure 10:
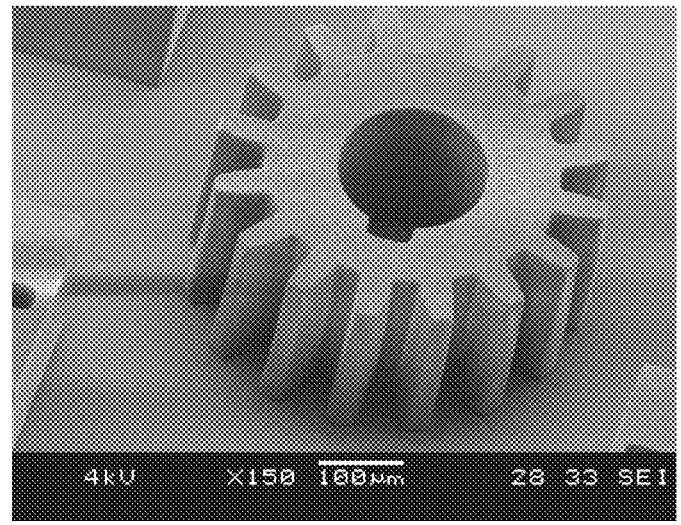
FIGS. 10 and 11 are images of sample molds formed from the process of FIG. 1.
Figure 11:
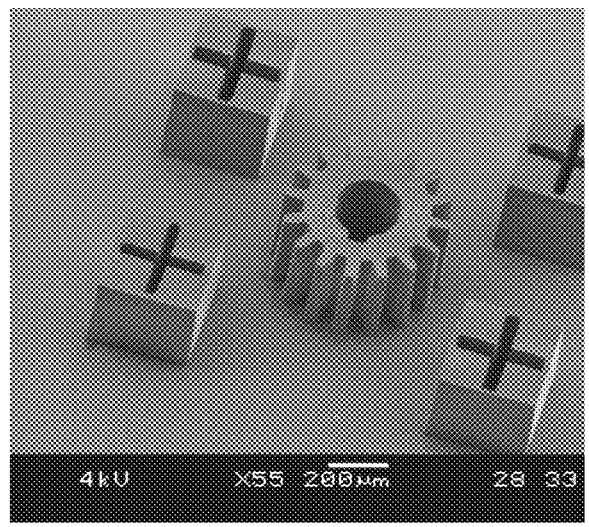

This example illustrates some high aspect ratio sample Ni molds for forming micro gears were prepared according to the process described in Example I. FIGS. 10 and 11 show photographs of representative sample molds for micro gears.

The sample molds had clean and defect-free smooth sidewalls and surfaces, and had sharp straight edges.

Example III

This example illustrates sample scaled-up molds were replicated from sample Ni molds produced in Example I according to an embodiment of the process illustrated in FIGS. 2A-2G.

For surface passivation, the sample master molds were treated in a passivation solution containing 10 wt % of $H_2O_2$ and de-ionized water for about 5 min at about 50° C. After the passivation treatment, the sample master molds were dried with $N_2$, and transferred to an electroplating machine for electroplating. The operating parameters for electroplating are similar to those used for fabricating normal molds.

Typical sample scaled-up Ni molds have overall sizes of 4 in×4 in (about 10 cm×10 cm) with nano-scale features from 20 nm to 100 nm L/S. In some sample scaled-up molds, the nano-features were formed in 2 cm×2 cm squares. The nano-features may be covered with a plastic cover sheet to protect the nano-features.

Figure 12:
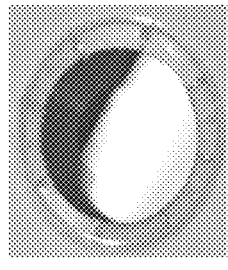
FIGS. 12, 13, and 14 are photographs of sample molds with different sizes and nano-structures formed from the processes of FIGS. 1 and 2.
Figure 13:
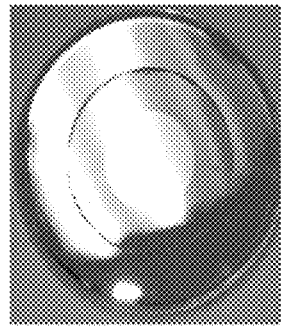
Figure 14:
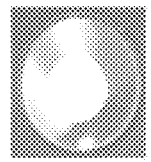
Figures 15, 16:
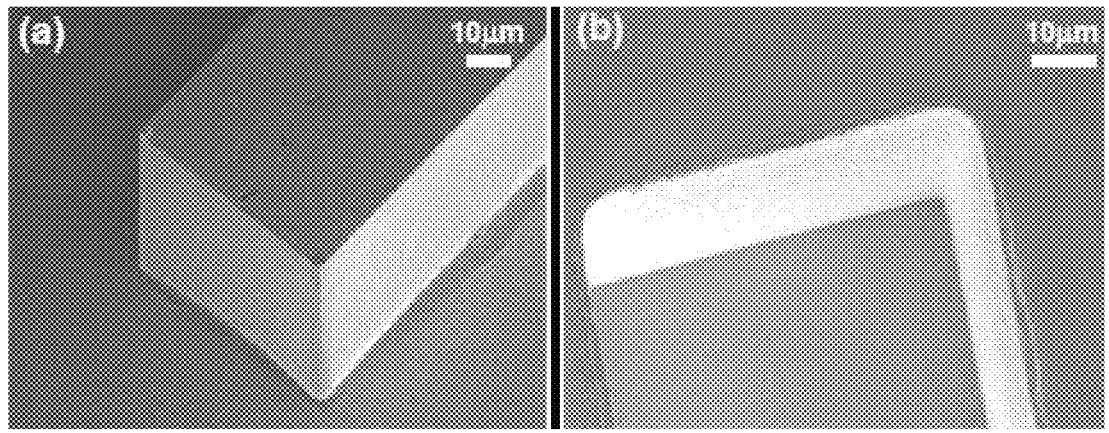
FIG. 15 is an SEM image of a sample Ni mold with micron-size ridges on its surface.
FIG. 16 is an SEM image of a sample scaled-up Ni mold, replicated from the Ni mold of FIG. 15.

FIGS. 12, 13, and 14 show scanning electron microscope (SEM) images of different scaled-up sample Ni molds. The Ni mold shown in FIG. 12 was prepared with deep UV patterning and had 80 nm L/S feature size. The mold shown in FIG. 13 was subjected to surface treatment and had 110 nm L/S feature size, and was suitable for use in fabrication of DVD Blu-ray Discs. The Ni mold shown in FIG. 14 had 20 nm L/S feature size and was suitable for use in fabrication of hard disks.

Example IV

This example shows sample high resolution Ni molds for hard disks with feature sizes down to 20 nm and thicknesses from 40 micrometers to 300 micrometers were prepared according the procedures of Examples I and III.

FIGS. 15, 16, 17 and 18 are SEM images of samples with micron-size structures. The nano-features on the surfaces of the samples had about 20 nm L/S size and a high resolution and were formed within a 2 in×2 in (about 5 cm×5 cm) square area.

Figures 17, 18:
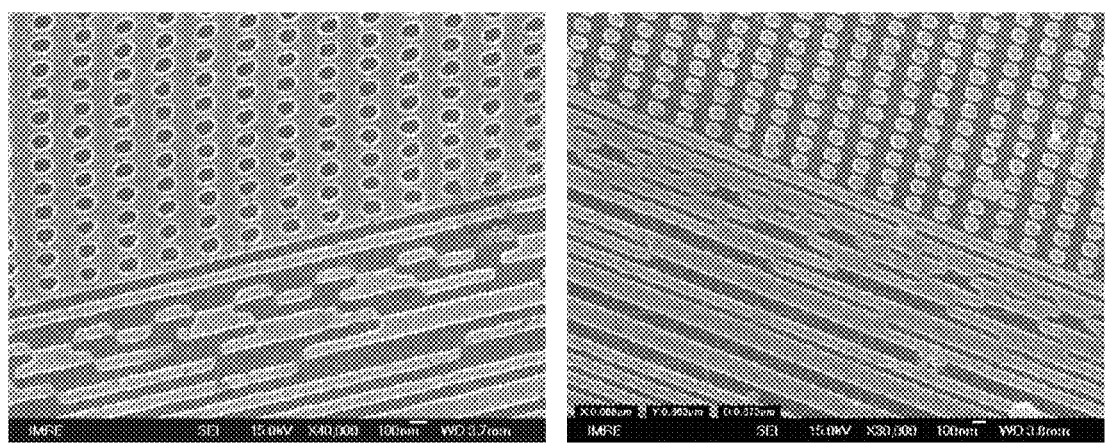
FIG. 17 is an SEM image of a sample master mold.
FIG. 18 is an SEM image of a sample scaled-up Ni mold copied from the master mold of FIG. 17.

FIG. 17 shows surface features of a sample template. FIG. 18 shows surface features of a sample Ni mold formed using the sample template of FIG. 17, according to the process in Example I.

Based on atomic force microscopy (AFM) measurements on the side-walls of the ridges on the surface of the sample molds (stamps), the RMS (root-mean-square) roughness was about 7 nm. The hardness and Young's modulus of the sample molds were measured by nano-indentation measurements, as being about 5 GPa and 213 GPa respectively.

It will be understood that any range of values herein is intended to specifically include any intermediate value or sub-range within the given range, and all such intermediate values and sub-ranges are individually and specifically disclosed.

It will also be understood that the word "a" or "an" is intended to mean "one or more" or "at least one", and any singular form is intended to include plurals herein.

It will be further understood that the term "comprise", including any variation thereof, is intended to be open-ended and means "include, but not limited to," unless otherwise specifically indicated to the contrary.

When a list of items is given herein with an "or" before the last item, any one of the listed items or any suitable combination of two or more of the listed items may be selected and used.

Of course, the above described embodiments are intended to be illustrative only and in no way limiting. The described embodiments are susceptible to many modifications of form, arrangement of parts, details and order of operation. The invention, rather, is intended to encompass all such modification within its scope, as defined by the claims.

What is claimed is:

1. A method comprising:
   selecting a metal and a corresponding etchant such that said etchant selectively etches said metal over nickel;
   sputtering said metal onto a surface of a template having nano-structures to form a sacrificial layer covering said nano-structures;
   electroplating nickel onto said sacrificial layer to form a nickel mold, leaving a portion of said sacrificial layer exposed; and
   contacting said sacrificial layer with said etchant through said exposed portion of said sacrificial layer to etch away said sacrificial layer until said nickel mold is separated from said template, said nickel mold having a front side having nano-structures and a back side opposite said front side; and
   replicating said nickel mold by electroplating to produce a replicate mold having nano-structures that match said nano-structures on said template, wherein said replicating comprises:
   placing said nickel mold in an opening of a metal base sized to receive said nickel mold, wherein a conductive film is sandwiched between said nickel mold and said metal base; and
   electroplating nickel onto said nickel mold and said metal base to form said replicate mold, wherein said replicate mold is larger than said nickel mold.

2. The method of claim 1, wherein said metal is copper.

3. The method of claim 2, wherein said etchant is a mixture of water, ammonia and hydrogen peroxide.

4. The method of claim 1, wherein said nano-structures have a feature size of about 10 nm to about 100 nm.

5. The method of claim 1, wherein said nano-structures have an aspect ratio of 3 or higher.

6. The method of claim 1, wherein said Ni mold has an overall size of about 5 cm to about 10 cm, and said replicate mold has an overall size of about 10 to about 50 cm.

7. The method of claim 1, wherein said sacrificial layer has a thickness of about 10 nm to about 100 nm.

8. The method of claim 1, comprising limiting exposure of said sacrificial layer to oxygen to prevent oxidation of said metal in said sacrificial layer before etching said sacrificial layer.

9. The method of claim 8, wherein said limiting exposure of said sacrificial layer to oxygen comprises immersing said sacrificial layer in an inert gas or covering said sacrificial layer with a removable shield layer.

10. The method of claim 1, wherein said template comprises a polymeric resist formed on a substrate.

11. The method of claim 1, wherein said metal base has a size of about 10 to about 50 cm.

12. The method of claim 1, comprising passivating a surface of said Ni mold and said metal base before said replicating.

13. The method of claim 1, further comprising depositing a conductive material in a groove formed between said nickel mold and said metal base to fill said groove.

14. The method of claim 13, wherein said conductive material comprises an epoxy.

15. The method of claim 1, wherein said conductive film is a magnetic foil.

16. The method of claim 1, further comprising applying a conductive tape on said metal base and said nickel mold to provide electric contact therebetween.

17. The method of claim 1, further comprising separating said replicate mold from said metal base.

* * * * *